United States Patent [19]

Young

[11] Patent Number: 4,486,464
[45] Date of Patent: Dec. 4, 1984

[54] METHOD OF MAKING PLANARIZING NON-CONDUCTIVE LAYERS EMPLOYING CONDUCTIVE METALS

[75] Inventor: Peter L. Young, North Wales, Pa.

[73] Assignee: Sperry Corporation, New York, N.Y.

[21] Appl. No.: 424,923

[22] Filed: Sep. 27, 1982

[51] Int. Cl.³ .......................................... H01L 39/24
[52] U.S. Cl. ...................................... 427/63; 427/99; 427/250; 427/255.1; 427/255.7; 427/404; 156/656; 156/659.1
[58] Field of Search ................ 427/63, 99, 250, 255.1, 427/255.2, 255.7, 404; 156/656, 659.1

[56] References Cited

U.S. PATENT DOCUMENTS

| 4,129,167 | 12/1978 | Sigsbee | 427/62 |
| 4,224,361 | 9/1980 | Romankiw | 427/99 |
| 4,256,816 | 3/1981 | Dunkleberger | 427/63 |
| 4,339,305 | 7/1982 | Jones | 204/192 C |
| 4,353,935 | 10/1982 | Symersky | 427/89 |

OTHER PUBLICATIONS

Greiner et al., Fabrication Process for Josephson Integrated Circuits, IBM J. Res. Develop., vol. 24, No. 2, Nov. 1980.

Primary Examiner—Norman Morgenstern
Assistant Examiner—Richard Bueker
Attorney, Agent, or Firm—John B. Sowell; Thomas Scott; Marshall M. Truex

[57] ABSTRACT

During the manufacture of Josephson junction devices, it is necessary to provide superconducting layers for electrodes. During the manufacture of semiconductors, it is necessary to provide conductive paths and leads. A layer of conducting metal or superconducting metal may be vacuum deposited in such a manner that any predetermined pattern or shape of normally conducting metal is made transversely non-conducting. The layer metal which is transversely non-conductive is vacuum deposited in the presence of an inert gas at a pressure which is high enough to cause the evaporated and deposited metal to form islands of conductive metal separated by insulating voids to provide gross electrical anisotropy.

10 Claims, 8 Drawing Figures

ENLARGED 50,000X

METHOD OF MAKING PLANARIZING NON-CONDUCTIVE LAYERS EMPLOYING CONDUCTIVE METALS

BACKGROUND OF THE INVENTION

1. Field of the Invention

This invention relates to a new method of making planarizing layers for superconducting and for semiconductor devices. More particularly, this invention relates to a method of vacuum depositing a layer of conductive metal which is made laterally non-conductive while retaining its conductivity in the vertical direction.

2. Description of the Prior Art

Layers of conducting and insulating materials are built up on a substrate when making a semiconductor device. Some of the layers are formed as distinct patterns. Each vacuum deposited layer formed over a pattern is substantially uniform in thickness and follows the contour of the previous patterned layers. As a result, the subsequently vacuum deposited layer becomes substantially thinner at the edge of a raised pattern than at its adjacent area. This weakened area or portion is called a step and is known to cause device failures during the process of manufacturing of semiconductor and superconducting devices. The step or weakened area is also known to cause device failures of devices which have passed manufacturing acceptance test. Thermal cycling and stress concentrations at the weakened area result in such delayed failures.

The weakened step area is most pronounced when the base electrode of a Josephson junction device is formed on a substrate and then substantially isolated by a layer of insulating material such as silicon dioxide which is formed over the base electrode area. In my copending application, Ser. No. 362,578 filed Mar. 26, 1982, a method of eliminating the harshness of the insulating layer step in the Josephson junction device is described. In this copending application, the insulating layer is formed by two separate and distinct deposition steps combined with a known step of forming the base electrode.

It is known that some single crystal compounds exhibit anisotropy in their electrical conductivity properties (the conductivity is higher in one direction than in the other directions). Heretofore, there was no conducting or superconducting metal known to be vacuum deposited so that it exhibited gross electrical anisotropy.

It would be desirable to provide a novel electrical anisotropic planarizing layer of conductive metal for use in the manufacture of superconducting devices and semiconducting devices.

SUMMARY OF THE INVENTION

It is a primary object of the present invention to provide a method of vacuum depositing superconducting lead and lead-alloys to form planarized base electrodes for Josephson junction devices.

It is another primary object of the present invention to provide a method of vacuum depositing conductive metals so that they are non-conducting in the direction transverse to the direction of deposition.

It is yet another primary object of the present invention to provide a method of vacuum depositing a normally conducting metal layer over a layer or a pattern of conductive metal which is non-conducting in a transverse direction to provide a composite layer deposited thereon which is made non-conducting in the transverse direction.

It is another general object of the present invention to provide a method of vacuum depositing normally conductive metals so that the layer deposited is formed of independent islands of the metal separated by voids which are insulating to create a transversely non-conductive layer.

It is another general object of the present invention to provide a method of depositing a first layer of conducting metal that is transversely non-conducting and then depositing thereon a pattern of conductive metal that results in the composite layer over the pattern being conductive in all directions.

According to these and other objects of the present invention, there is provided an insulated substrate wafer which is placed in a high vacuum environment at approximately $1.0 \times 10^{-6}$ torr. An inert gas is metered into the high vacuum system to increase the vacuum pressure to approximately $30 \times 10^{-3}$ torr. A conductive metal is then vacuum deposited on the insulating substrate to provide a layer which is transversely non-conducting and vertically conducting. This layer may be used as a base electrode of a Josephson junction device or for the manufacture of conductive paths in superconducting devices and semiconductor devices.

DESCRIPTION OF THE PREFERRED EMBODIMENT

For purposes of this application, the term electrical anisotropy shall mean that the deposited conductive metal is more conductive in one direction than in another direction.

For purposes of this application, the term non-conducting is applied to the resistivity of the deposited metal layer in a direction which is transverse to the direction in which is was vacuum deposited and the resistivity in this transverse direction is substantially infinite.

For purposes of this application, the term high pressure durable conducting metal shall mean a conducting metal which has been deposited in a vacuum chamber in the presence of an inert gas such as argon which causes the conducting metal to be approximately two to twenty times higher in resistivity than the normal conducting base metal.

In my copending application, Ser. No. 362,568 filed Mar. 26, 1982, a method of making high reliability lead-alloy Josephson junction devices was disclosed. It was found that when lead-alloy base electrode materials were vacuum deposited in the presence of relatively high pressure inert gases such as argon, that the conductivity decreased but could be controlled and deposited as a uniform conductive layer. The method was employed to produce lead-alloy base electrode materials which are referred to herein as high pressure durable conducting metal, but is not restricted to a deposition of lead-alloy superconducting metals.

When lead-alloy layers, such as lead-indium-gold layers used in Josephson junction devices are deposited under high argon pressure of the order of twenty microns, the transverse or lateral resistivity of the layer begins to increase very rapidly. It has been found that as the argon pressure in the vaccum chamber exceeds approximately thirty microns, the lateral or transverse resistance of the deposited layer approaches infinity. In addition to controlling the argon pressure, it has been found that the resistivity of the non-conducting lead-alloy layers may be varied by increasing the flow rate of the argon gas or by making the vacuum deposit of the lead-alloy layers at an oblique angle of deposition. Before the present invention transversely non-conducting layer of conducting material was vacuum deposited, no vacuum deposited metal was known which exhibited gross electrical anisotropy.

Figure 1:
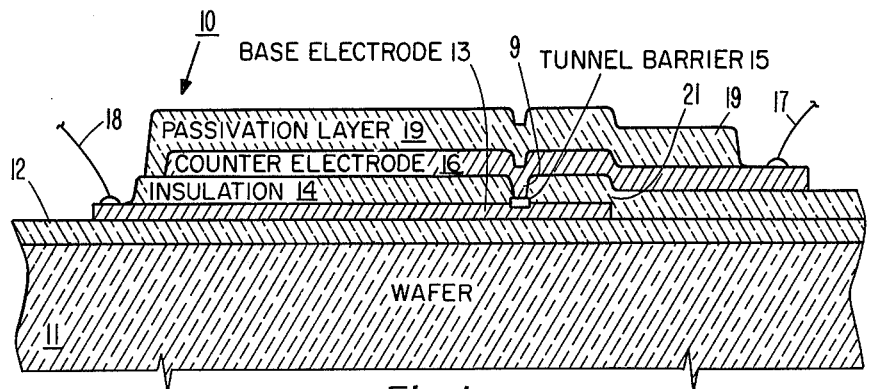
FIG. 1 is a schematic cross-section view of a typical prior art Josephson junction device showing the large step formed over the base electrode.

Refer now to FIG. 1 which is a schematic cross-section view of a typical prior art Josephson junction device. A plurality of such Josephson junction devices may be made on the same substrate wafer 11 which has been cut and polished for use in the manufacture of semiconductor devices and superconducting devices. The standard silicon wafer 11 is approximately thirteen mils thick and has a thermally grown silicon dioxide ($SiO_2$) layer formed thereon which insulates and isolates the conductive silicon from the Josephson junction device to be made. The insulation layer 12 has deposited thereon a layer or a series of layers shown as base electrode 13 which in the preferred embodiment are formed from lead or lead-alloys. An isolated area 9 of the base electrode 13 is provided by well known photoresist mask techniques followed by the vacuum deposition of a silicon oxide insulation layer 14 over substantially all of the base electrode surface 13 except for the mask which defines the window or aperture 9 in which the tunnel barrier junction 15 will be deposited. A counter-electrode 16 is deposited over the tunnel barrier junction 15 and the insulation layer 14. A passivation layer 19 is applied over substantially all of the counter-electrode 16 to complete the Josephson junction device 10. Conductive leads 17 and 18 are applied to the exposed counter-electrode 16 and the base electrode 18 respectively. It will be noted that the silicon oxide insulation layer 14 deposited over the base electrode 13 causes a step change at the point 21 which is thinner than the vertical thickness of the insulation layer 14. This weakened or stress concentration area 21 is known to fracture during the process of making Josephson junction devices and causes unacceptable or reject devices. Further, even after the Josephson junction device is made and is acceptable, the weakened or stress concentration area 21 has been known to break or fracture due to thermal cycling and produce failures after passing manufacturing acceptance tests. Thus, it is highly desirable to reduce the stress concentration area and to planarize the layers forming the Josephson junction device so that the stress concentration or weakened area 21 is substantially eliminated and much higher yields are produced. Also, when the Josephson junction device layers are substantially planarized, the line resolution of the individual mask and patterns may be made much more accurate than when the step changes occur on the device.

Figure 2:
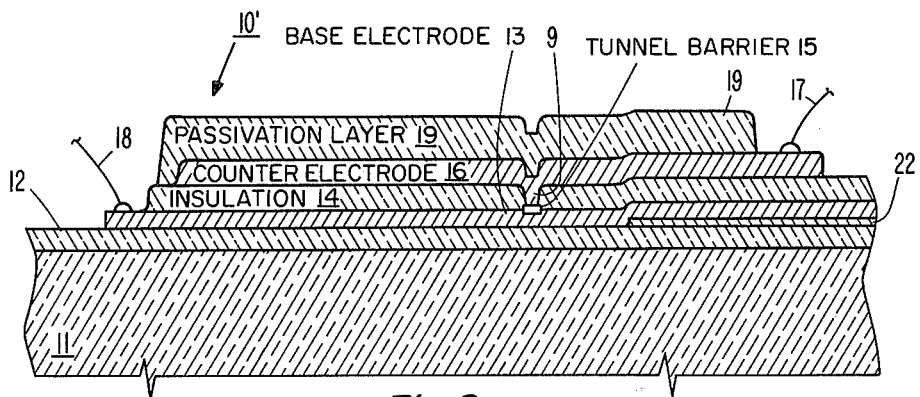
FIG. 2 is a schematic cross-section view of the same Josephson junction device in which the present invention layer has been employed to eliminate the step over the base electrode.

Refer now to FIG. 2 showing the new and improved Josephson junction device 10'. After the silicon dioxide ($SiO_2$) layer 12 is formed on the substrate wafer 11, a pattern layer 22 of conductive metal approximately two hundred angstroms thick is formed by employing known photographic techniques. As will be explained hereinafter in greater detail, the layer 22 is formed so that it is vertically conductive and horizontally (transversely) non-conductive. The base electrode 13 conductive metal layer is formed over the pattern layer 22 as well as the exposed layer 12. The base electrode material is preferably formed as high pressure durable superconductive metal which is described and claimed in my copending application, Ser. No. 362,568 filed Mar. 26, 1982. It has been found that the base electrode 13 is preferably deposited as an alloy of lead or as separate layers of pure metals which form as an alloy when annealed. When a base electrode metal is deposited in a vacuum chamber that was first pumped down to a high vacuum and then was continuously purged with an argon inert gas during the deposition of the base electrode, the material is extremely stable and substantially immune to thermal cycling. As explained in my copending application, the inert gas is continuously introduced into the partial vacuum of the vacuum system while holding a pressure of approximately $20 \times 10^{-3}$ torr, during deposition of the base electrode 13. More importantly, the area of the base electrode 13 which is deposited over the transversely non-conductive pattern layer 22 becomes transversely non-conducting! However, the remainder of base electrode 13 which is deposited over the insulating 12 is conducting in all directions. The remaining layers of the Josephson junction 10' are formed after the deposition of base electrode 13 in the same manner as explained hereinbefore with regards to FIG. 1 and the layers are numbered the same. It will be noted that the stress concentration area 21 has been virtually eliminated. While a raised step is shown in the FIG. 2 embodiment, it will be understood that the thickness of the layer 22 is only approximately two hundred angstrums thick and the drawing has been exaggerated in order to show a layer 22 which virtually is non existant.

Figure 3:
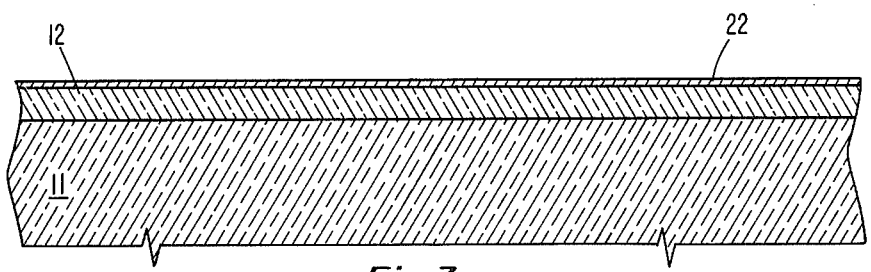
FIG. 3 is a schematic cross-section view of a substrate having the novel conducting metal deposited thereon.

Refer now to FIG. 3 which is an enlarged schematic cross-sectional view showing a continuous layer 22. In the preparation of the planarized Josephson junction device 10' shown in FIG. 2, it is preferred to lay down a continuous layer of transversely non-conducting conductive metal approximately two hundred angstrums thick on top of the insulating layer 12. After this layer is laid down in the vacuum chamber in the presence of an argon atmosphere at a pressure in excess of $30 \times 10^{-3}$ torr, the layer has been found to be transversely non-conducting as will be explained in greater detail hereinafter. After the layer 22 is laid down on the substrate wafer 11, 12, it is removed from the vacuum chamber system and etched to provide the pattern shown in FIG. 2. The etching may be accomplished by employing known chemical formulas or by ion milling as is also well known in this art.

Figure 4:
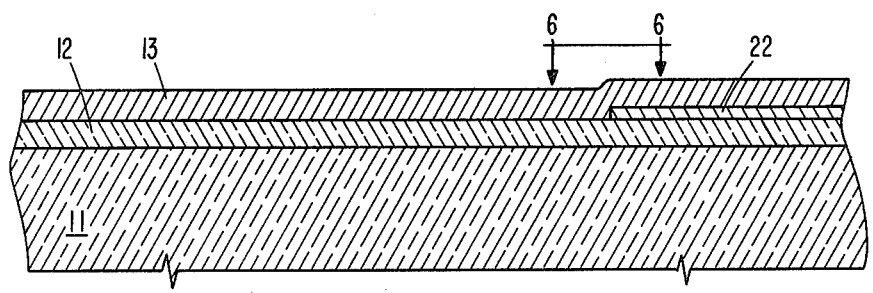
FIG. 4 is a schematic cross-section view of the novel layer shown in FIG. 3 after being etched to produce a predetermined pattern and having a high pressure durable superconducting metal base electrode deposited thereon.

Refer now to FIG. 4 which shows the pattern 22 after removal of a portion of the layer 22 from the left side of the drawing. The partially complete Josephson junction device with pattern 22 thereon is again returned to the vacuum system and the vacuum system pumped down to a high pressure of approximately 1.0 to $1.5 \times 10^{-6}$ torr. After pumping the system down to remove all impurities, an argon inert gas is introduced and the high pressure durable conductive base electrode 13 is then deposited over the pattern 22. As explained hereinbefore, the pattern layer 22 is transversely non-conducting and it was found that depositing the high pressure durable conductive base electrode material on top of this transversely non-conducting pattern resulted in causing the portion of the base electrode material 13 which is directly above the pattern layer 22 to also be transversely non-conducting. It is believed that when the base electrode 13 is deposited on the uniquely transversely non-conducting layer 22 that it does not fill the voids which will be described in detail hereinafter and thus also becomes transversely non-conducting.

Figure 5:
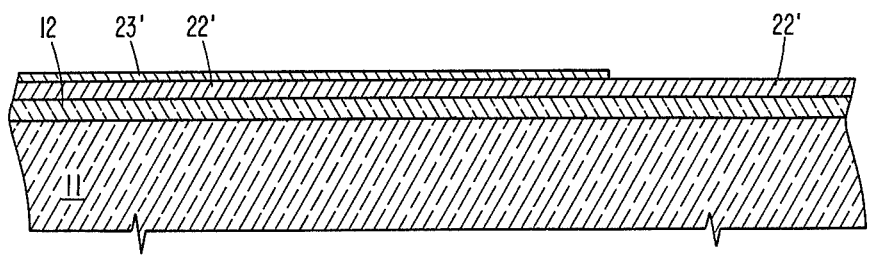
FIG. 5 is a schematic cross-section view of an alternative embodiment to the structure shown in FIG. 4.

Refer now to FIG. 5 which is a schematic cross-sectional view of an alternative embodiment Josephson junction device partially completed. The alternative embodiment shown in FIG. 5 is substantially a reversal of the parts of the layers shown in FIG. 4. The substrate comprises the wafer 11 and the insulating layer 12 on which a substantially thick transversely non-conductive layer 22 is deposited. In the FIG. 4 embodiment, the layer 22 is anywhere from two hundred to four hundred angstroms thick and in the FIG. 5 embodiment, the transversely non-conductive layer 22' which will become the base electrode is preferably fifteen hundred to twenty-five hundred angstroms thick. After the formation of the layer 22', the partially complete device is removed from the vacuum system and a photolithographic mask applied before being returned to the vacuum system where a conventional lead or lead-alloy superconducting metal 23' is applied over the selected pattern area of the layer 22'. It has been found that the superconductive metal layer 23' fills the voids between the islands of material and causes the layers 23' and 22' to become homogeneous and electrically conductive in all directions while the layer 22' shown to the right of the layer 23' remains transversely non-conductive.

Figure 6:
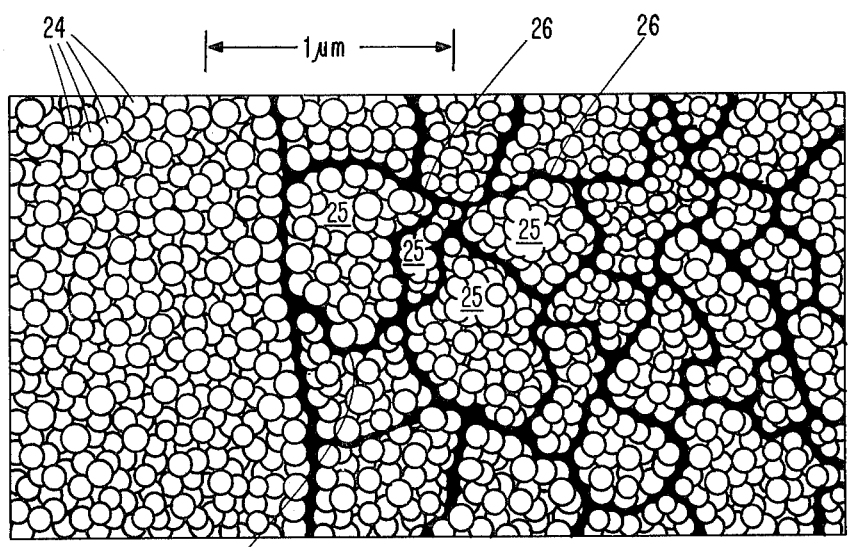
FIG. 6 is a drawing depicting an actual scanning electron microscope photograph taken at the junction area shown at the lines 6—6 of FIG. 4.

Refer now to FIG. 6 which is a drawing of a scanning electron microscope photograph view taken at the junction shown at lines 6—6 of FIG. 4. It will be noted that the base electrode 13 comprises a plurality of micro-crystals 24. These micro-crystals 24 of conductive metals are physically and electrically connected to each other to form a homogeneous base electrode 13. The adhesion between micro-crystals has been noted to be much stronger than conventionally deposited electrode material. The base electrode material 13 which is deposited over the transversely non-conductive pattern layer 22 has a completely different physical appearance. The micro-crystals 24 are formed into islands or areas 25 which are separated by insulating voids 26. These insulating voids 26 extend vertically completely through the layer 13 causing the portion of layer 13 which is deposited over the pattern layer 22 to be transversely non-conducting. The drawing is enlarged approximately 50,000× and has a one micron reference scale at the top. The vertical islands of conductive metal are smaller than one micron and are random in shape and are separated by the voids or insulating channels 26 which are approximately two hundred angstroms in width.

Figure 7:
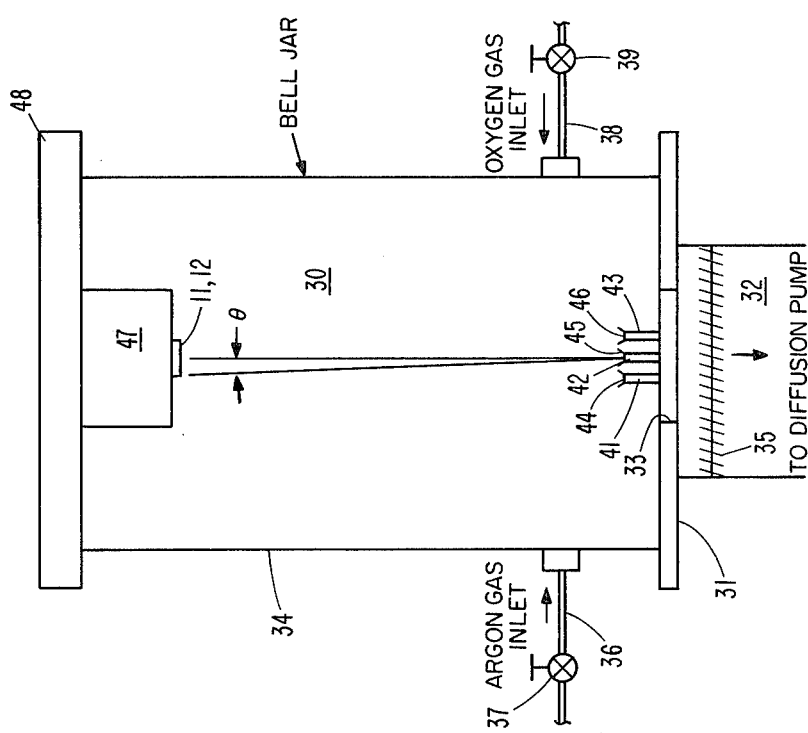
FIG. 7 is a schematic cross-section view of a vacuum bell jar system used to deposit the transversely non-conducting layers of conductive metal shown in FIGS. 4 to 6.

Refer now to FIG. 7 which is a schematic cross-sectional view of a vacuum bell jar system used to deposit the Josephson junction layers shown in FIGS. 1 to 5. The vacuum system 30 comprises base plate 31 having a diffusion pump 32 which is preferably bolted to the base plate and sealed to the bottom surface thereon. An aperture 33 in the base plate 31 connects diffusion pump 32 due to the bell jar 34 to provide a vacuum therein. The diffusion pump is of the type which is provided with a variable orifice adjustment 35. Also, connected to the bell jar 34 is a valve inlet 36 for providing inert gas to the vacuum chamber. A flow control valve 37 is provided at the inlet 36 to permit a predetermined flow of inert gas to the vacuum system 30. A second inlet 38 and control valve 39 are shown attached to the bell jar 34 to permit the introduction of other gases such as oxygen which are used in the process. Supported on top of the base plate 31 are shown three thermal evaporation systems 41, 42 and 43. These thermal evaporation systems support standard tungsten boats 44, 45 and 46 into which the metals to be evaporated and deposited are placed. In the present embodiment, the boats 44, 45 and 46 are placed as near as possible opposite ($\theta = 0$) the substrate 11, 12 when depositing the high pressure durable base electrode material described hereinbefore. During all other deposition processes for the transversely non-conductive material the angle theta can vary anywhere from zero to twenty degrees and still maintain uniform results. It has been found that angles greater than twenty degrees still provide acceptable results but the high angle of theta cannot be maintained conveniently in the vacuum system. The top of the bell jar 24 is sealed with a stainless steel plate 48 which is employed to support the metal radio frequency cathode housing 47.

Figure 8:
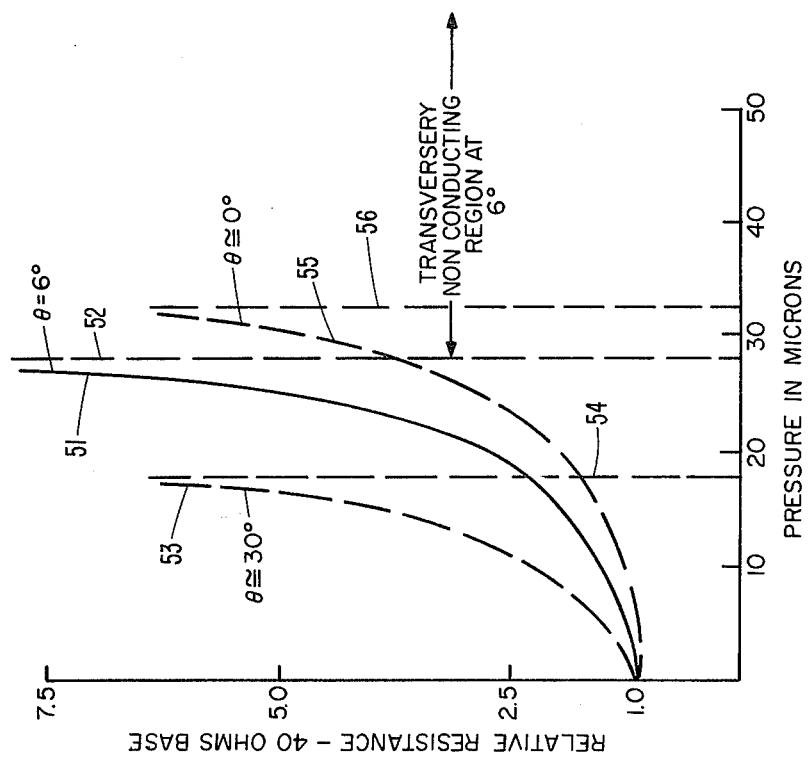
FIG. 8 is a graph of pressure in microns versus the relative resistance in ohms of the transversely non-conductive material shown in FIGS. 4 to 6.

Refer now to FIG. 8 which is a graph of argon inert gas pressure in microns versus the relative resistance of the deposited superconductive base electrode material. The base of 40 ohms is used to denote the resistance in a base electrode line before and after enhancement. When the base electrode material is deposited at an angle theta equal to six degrees, the resistivity of the base electrode material is shown by the curve 51. It will be noted that the boundary line 52 is associated with the resistivity curve 51 and when the lead-alloy base electrode material is deposited at an inert gas pressure in excess of approximately twenty-seven microns, the material becomes transversely non-conducting. However, when the inert gas pressure of the argon is reduced below approximately twenty-seven microns, the base electrode material becomes homogeneous and conductive in all directions and is the preferred structure for the base electrode 13. When the angle of deposition of the base electrode material is greatly increased to approximately thirty degrees, the same transversely non-conducting material may be deposited at approximately eighteen microns inert gas pressure as shown by the boundary line 54 associated with the resistivity curve 53 at a deposition angle of approximately thirty degrees. When the deposition angle theta is reduced to approximately zero degrees as shown by the resistivity curve 55, it is necessary to increase the inert gas pressure to approximately thirty-three microns as shown by the boundary line 56. In summary, FIG. 8 illustrates that it is possible to deposit superconducting and conducting metals in a high vacuum environment in the presence of inert gases such as argon so as to achieve two entirely new and beneficial layers. The conductive metal may be deposited as a transversely non-conducting layer or alternatively may be deposited as homogeneous low resistance electrode layer which is thermally stable and immune from deterioration due to thermal cycling.

Having explained the present invention with respect to the production of Josephson junction devices in which the base electrode materials are cycled between approximately one hundred degrees centigrade and the temperature of liquid hellium ($-269°$ centigrade), it will be understood that when the present invention material is used with standard semiconductor technology, that the range of cycling is substantially less. Thus, the present invention transversely non-conducting material may be employed in semiconductor devices to achieve conductive lines and patterns employing conductive metals as presently used in semiconductor technology. A pattern of very thin transversely non-conducting metal can be used to effectively block conductivity to adjacent lines and areas while maintaining very high line definition between areas. Deposition of metals such as aluminum and copper as used in semiconductor devices and packaging of VLSI devices will require different parameters of inert gas pressure.

I claim:

1. A method of making a planarized non-conductive pattern layer on a substrate, comprising:
    providing a thermally oxidized silicon substrate wafer,
    placing said substrate wafer in a vacuum chamber,
    producing a high vacuum in said vacuum chamber to approximately $1.0 \times 10^{-6}$ torr,
    metering a predetermined amount of inert gas into said vacuum chamber to provide a higher pressure than said high vacuum,
    evaporating and depositing a first conductive metal on said substrate to provide a layer which is laterally non-conductive and vertically conductive,
    removing said substrate from said vacuum chamber,
    etching a predetermined pattern in said laterally non-conductive layer of first conductive metal,
    placing said substrate in a vacuum chamber,
    producing a high vacuum in said vacuum chamber to approximately $1.0 \times 10^{-6}$ torr,
    evaporating and depositing a layer of high pressure durable conductive metal over said first conductive metal and said substrate to provide a layer of second conductive metal which is laterally non-conductive only where the second conductive layer is deposited over said first conductive layer.

2. A method of making a non-conductive pattern layer as set forth in claim 1 which further includes the step of maintaining said inert gas being metered into said vaccum chamber at a pressure of 18 to 100 microns during evaporation and deposition of said first conductive metal.

3. A method of making a non-conductive layer as set forth in claim 2 wherein said step of metering a predetermined amount of inert gas comprises metering argon inert gas into said vacuum chamber.

4. A method of making a non-conductive pattern layer as set forth in claim 3 wherein said step of evaporating and depositing a first conductive metal further comprises depositing said first conductive metal at an angle of deposition which does not exceed twenty degrees.

5. A method of making a non-conductive pattern layer as set forth in claim 1 wherein the step of metering a predetermined amount of inert gas into said vacuum chamber further includes restricting the flow rate of said inert gas to a flow rate of approximately forty cubic centimeters per minute.

6. A method of making a non-conductive pattern layer as set forth in claim 1 wherein said step of evaporating and depositing a first conductive layer comprises depositing a layer of lead alloy approximately two hundred to four hundred angstroms thick.

7. A method of making a non-conductive pattern layer as set forth in claim 1 wherein the step of evaporating and depositing a second conductive metal over said first conductive metal comprises depositing a high pressure durable lead alloy base electrode layer for a Josephson junction device approximately fifteen hundred to twenty-five hundred angstroms thick.

8. A method of making a non-conductive pattern layer as set forth in claim 7 wherein said lead alloy comprises at least fifty percent lead and the alloy metals comprise gold and indium.

9. A method of making a planarized non-conductive pattern layer on a substrate, comprising:
    providing a thermally oxidized silicon substrate wafer,
    placing said substrate wafer in a vacuum chamber,
    producing a high vacuum in said vacuum chamber to approximately $1.0 \times 10^{-6}$ torr,
    metering a predetermined amount of inert gas into said vacuum chamber to provide a higher pressure than said high vacuum,
    evaporating and depositing a first conductive metal on said substrate to provide a layer which is laterally non-conductive and vertically conductive,
    removing said substrate from said vacuum chamber,
    providing a predetermined photoresist pattern on said laterally non-conductive layer of first conductive metal,
    placing said substrate in a vacuum chamber,
    producing a high vacuum in said vacuum chamber to approximately $1.0 \times 10^{-6}$ torr,
    depositing a layer of second conductive metal over said laterally non-conductive layer of first conductive metal and said pattern to provide areas of exposed conductive metal which is laterally conductive where the second conductive layer is deposited over said first conductive layer, and
    removing said photoresist pattern and said second conductive metal which is deposited thereon leaving said laterally non-conductive layer of first conductive metal laterally non-conductive where said photoresist pattern was removed.

10. A method of making a planarized non-conductive pattern layer on a substrate, comprising:
    providing a photoresist patterned thermally oxidized silicon substrate wafer,
    providing a lift-off photoresist pattern on said substrate,
    placing said substrate wafer in a vacuum chamber,
    producing a high vacuum in said vacuum chamber to approximately $1.0 \times 10^{-6}$ torr, metering a predetermined amount of inert gas into said vacuum chamber to provide a higher pressure than said high vacuum, evaporating and depositing a first conductive metal on said substrate and said pattern to provide a layer which is laterally non-conductive and vertically conductive, removing said substrate from said vacuum chamber, removing said pattern and said laterally non-conductive layer of first conductive metal thereon, placing said substrate in a vacuum chamber, producing a high vacuum in said vacuum chamber to approximately $1.0 \times 10^{-6}$ torr, evaporating and depositing a layer of high pressure durable conductive metal over said first conductive metal and said substrate to provide a layer of second conductive metal which is laterally non-conductive only where the second conductive layer is deposited over said first conductive layer.

* * * * *